United States Patent [19]

O'Brien

[11] 4,419,629
[45] Dec. 6, 1983

[54] AUTOMATIC SYNCHRONOUS SWITCH FOR A PLURALITY OF ASYNCHRONOUS OSCILLATORS

[75] Inventor: Steven M. O'Brien, Norristown, PA

[73] Assignee: Sperry Corporation, New York, N.Y.

[21] Appl. No.: 162,962

[22] Filed: Jun. 25, 1980

[51] Int. Cl.³ .......................................... H03K 3/013
[52] U.S. Cl. ........................... 328/72; 307/269; 307/518; 328/104; 331/49
[58] Field of Search .............. 307/219, 269, 518, 529; 328/72, 75, 104, 154, 60, 63, 61; 331/49

[56] References Cited

U.S. PATENT DOCUMENTS 3,904,977  9/1975  Barsotti ............................. 328/154
3,932,816  1/1976  MacGregor ...................... 328/154
3,969,638  7/1976  Marchetti et al. ................ 328/154
4,156,200  5/1979  Gomez .............................. 307/219

Primary Examiner—John Zazworsky
Attorney, Agent, or Firm—John B. Sowell; Kenneth T. Grace; Marshall M. Truex

[57] ABSTRACT

A switching circuit for automatically selecting one of a plurality of normally operable asynchronous oscillators is provided with a selection switch for selecting a new oscillator while the formerly selected oscillator is still producing an output. The switching circuit employs the output of the newly selected oscillator to disable the formerly selected oscillator and to subsequently enable the output of the newly selected oscillator to be coupled to the oscillator output of the switching circuit, thus, preventing switch-over from one oscillator to the other during a metastable period.

10 Claims, 5 Drawing Figures

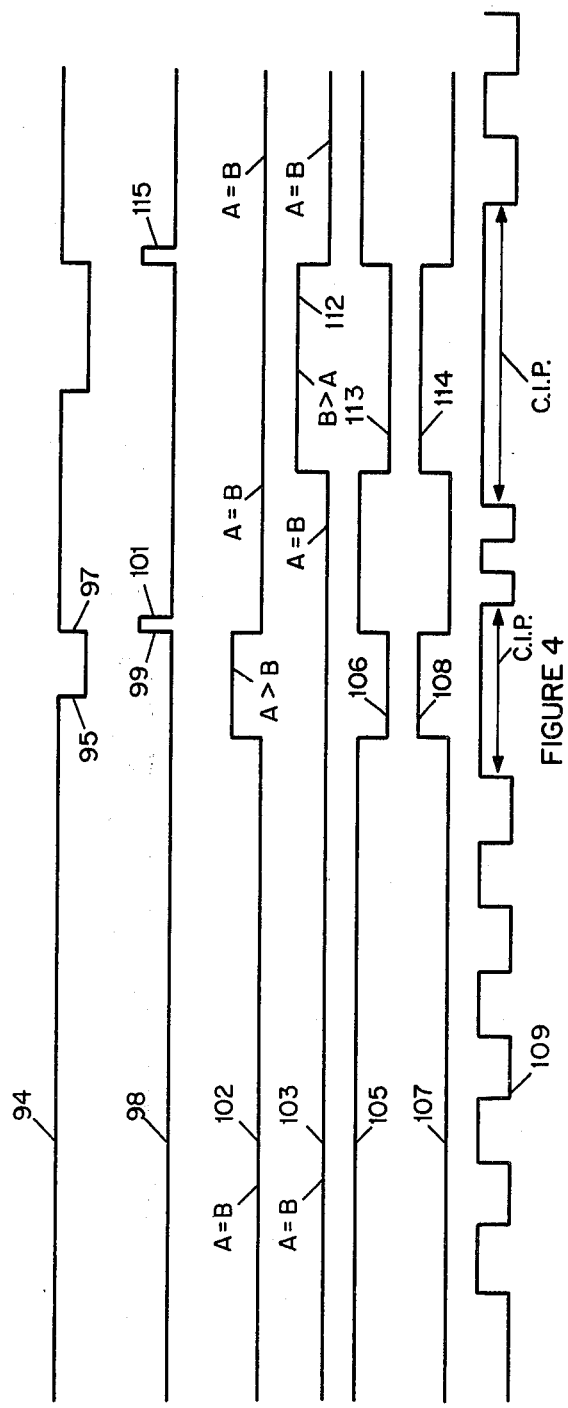

AUTOMATIC SYNCHRONOUS SWITCH FOR A PLURALITY OF ASYNCHRONOUS OSCILLATORS

BACKGROUND OF THE INVENTION

1. Field of the Invention

This invention relates to clock systems employed to synchronize or to time the operation of data processors, logic circuits and input-output units associated with electronic data processing systems. More particularly, this invention relates to a switching circuit for selecting one of a plurality of normally operable asynchronous oscillators employed in timing circuits so as to assure synchronization and to avoid metastability.

2. Discussion of the Prior Art

It is well known that two computers or elements of a complex data processing system which attempt to communicate with each other in a random asynchronous manner are susceptible of creating a metastable condition. For purposes of this invention, a metastable condition is defined as an attempt to change the state of a logic element before the element has had time to become stable or enabled sufficiently to accept or sense the change signal. This creates a condition which will not assure that the desired output is correct. The output of a logic element which is in a metastable condition may be correct or incorrect.

In theory, two viable alternatives have been suggested to circumvent the problem of metastability and interface synchronization. First, permit the parts of the system to remain nonsynchronous and employ sampling techniques which identify time regions in which metastable conditions do not exist. This first approach creates a time lag which is unacceptable to high speed computing systems. The sampling circuits for such a complex system may become costly and difficult to implement.

An alternative approach has been to synchronize all of the interfaces of the components in the system and to create clocking schemes which will guarantee that metastable regions cannot occur. This alternative approach has been implemented is Sperry Univac's distributed processing systems and is described in U.S. Pat. No. 4,021,784.

In the above-identified Sperry Univac system, there are a plurality of clocks associated with a plurality of computers. Each computer has associated therewith, input/output equipment and its own clock. Logic circuits are employed to selectively connect only one of the asynchronous clocks to the total system. The logic circuits are provided with individual timed output lines connected to the central processing units and to the individual input/output units. During a switching operation, all timed outputs are temporarily blocked for a predetermined number of computer cycles. The previous clock is blocked and the new clock is subsequently enabled at least one or more cycle times later. When several clocks are present in a distributed processing system, they are located at the individual processing units and thus are a substantial distance from each other, and such precautions are required as well as being justified.

When a central processing system is provided with a similar frequency back-up clock which is asynchronous with the master clock, or when the central processing system is provided with a substantially slower or faster asynchronous clock, they can be located at or near the master clock. In a typical system having a plurality of asynchronous clocks of different frequencies, the slower clocks are employed for maintenance purposes and may be on the same circuit board.

When a plurality of asynchronous clocks are located close enough to each other to be synchronized or substantially synchronized, the compensation for cable delays can be ignored or easily overcome.

SUMMARY OF THE INVENTION

It is a primary object of the present invention to provide an automatic synchronous switching circuit for a plurality of asynchronous oscillators or clocks in a computing system.

It is another primary object of the present invention to provide an automatic synchronous switching circuit for a plurality of asynchronous oscillators of substantially different frequencies.

It is another primary object of the present invention to provide an automatic synchronous switching circuit which employs the new clock pulses to select itself without overlapping the old clock pulses.

It is yet another object of the present invention to provide an automatic synchronous switching circuit which is simple and faster than circuits employed heretofore.

These and other objects of the present invention are provided in a switching circuit having a plurality of asynchronous oscillators normally operable and available at the input of the switching circuit and having only one previously selected oscillator available at the output. A synchronized change from the previously selected oscillator to a newly selected oscillator is implemented by selecting the new oscillator and coupling its output to a first control selection means which provides a delayed synchronized switch signal. The delayed synchronized switch signal is then employed to select itself by coupling it to a second control selection means which provides the newly selected oscillator at the output of the switching circuit.

BRIEF DESCRIPTION OF THE DRAWINGS

FIGS. 3 and 4 are timing charts showing the pulses associated with the schematic block diagram of FIG. 2; and FIG. 5 is a truth table for the comparator of FIG. 2.

DESCRIPTION OF THE PREFERRED EMBODIMENT

Figure 1:
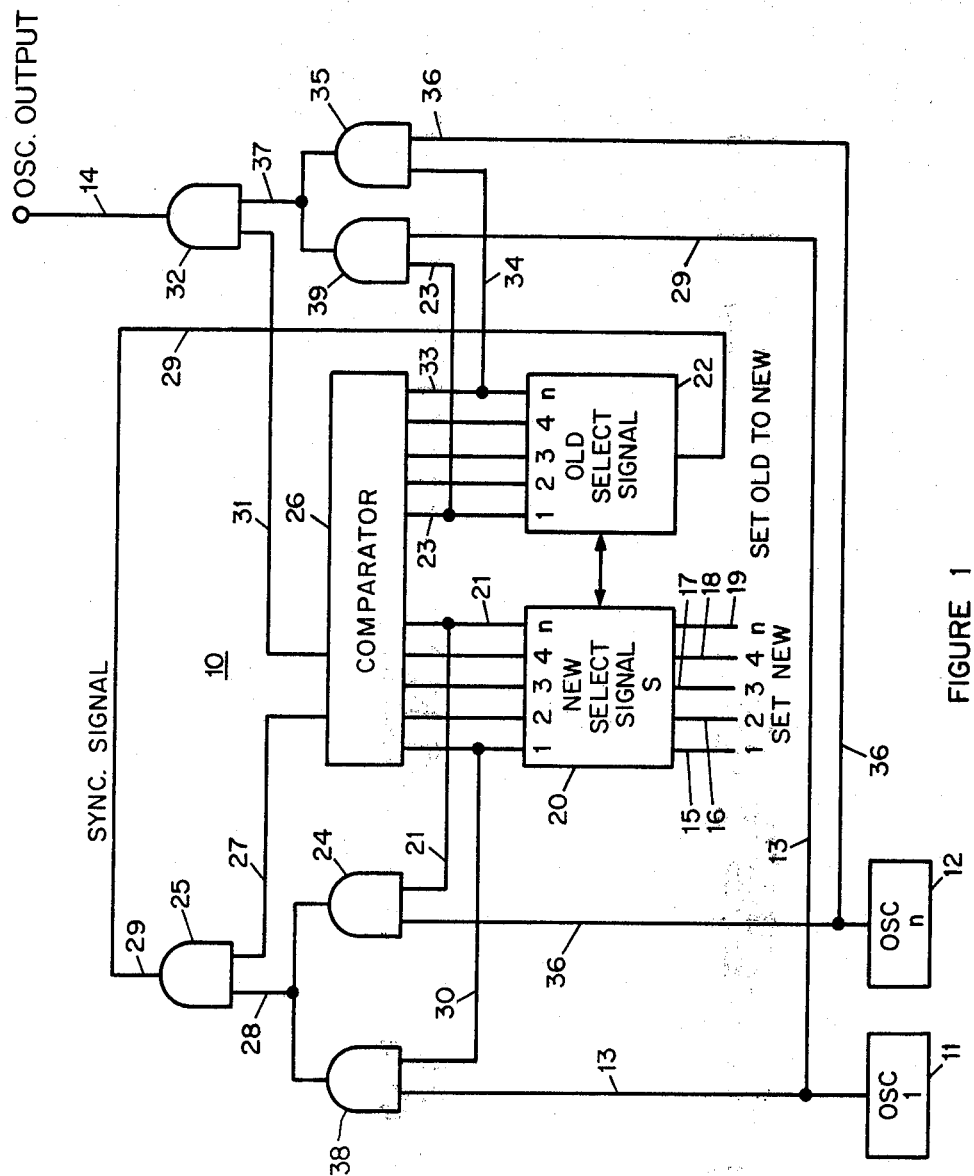
FIG. 1 is a general schematic block diagram of a preferred embodiment of the present invention.

Refer now to FIG. 1 showing a general schematic block diagram of a synchronous switching circuit 10. The inputs to the circuit 10 comprise a plurality of oscillators 11, 12 etc. (not shown) designated 1 to N. The oscillators 11, 12 may be of the same frequency or different frequencies. Since the oscillators are not phase locked together, the frequencies are not interdependent and are not synchronized.

Assume for the purposes of discussion that oscillator 11 is operable at input line 13 and its output is being presented at output line 14 as will be explained hereinafter. When it is desirable to switch oscillator 11 off and oscillator 12 on, the change cannot be made simultaneously because it may create a metastable condition in the switching circuit 10 or in the system (not shown) connected to the output line 14.

Assume that the oscillator 11 was previously selected by presenting a select signal on line 15, and now a new oscillator will be selected. If a select signal is still present on line 15 and oscillator N is to be selected, the select signals may be changed simultaneously. In the system shown after the select signal 1 has been employed on line 15 to select oscillator 11, it is not necessary to maintain this select signal and it may be dropped. Raising a select signal on any of the lines 16 through 19 will cause the associated oscillator to be selected. For example, if a signal is raised on select line 19, oscillator N will be selected as follows. Switch selection means (not shown) presents a select signal on line 19 to set the new select storage element 20 which generates a new oscillator selection output signal on line 21, representative of the oscillator "N". The old oscillator select element 22 still retains the previous selected oscillator 11 and is presenting a high output on line 23. When line 21 goes high, the high output of line 21 is presented to AND gate 24 along with the output of oscillator 12 causing a high output at AND gate 24 to be presented to one of the inputs to AND gate 25. The other input of AND gate 25 is a normally low output from comparator 26 on line 27. The output of comparator 26 is normally low when the output of logic element 20 is equal to the output of logic element 22. However, when line 21 goes high and line 23 has been high and is still high, the comparator 26 senses that a change has taken place and the normally low output on line 27 is switched to a high condition. The high condition on line 27 and the high condition on line 28 from AND gate 24 causes AND gate 25 to go high and generate a sync signal on line 29 in synchronism with oscillator 12. It will be understood that the term in synchronism means that the signal being presented on line 29 is delayed by AND gates 24 and 25 as well as the interconnecting lines. When comparator 26 senses the change on the lines from logic elements 20 and 22, the signal on normally low line 27 was changed from low to high. Similarly the output on normally high line 31 is switched from high to low generating an inhibit signal at AND gate 32, thus, blocking the output of formally selected oscillator 11 on output line 14. The sync signal on line 29 is employed as an input to logic element 22 and sets the old select storage element 22 from oscillator 11 to the newly selected oscillator 12 causing the line 33 to go high. Now line 21 and line 33 are high and comparator 26 senses equality output between logic elements 20 and 22 causing normally low line 27 to go low and normally high line 31 to go high again. While this change is taking place at the output of comparator 26, the high signal on line 34 is presented as an enabling input to AND gate 35. The newly selected oscillator 12 is also connected via line 36 as an input to AND gate 35 causing an output on line 37 in synchronism with oscillator 12. Line 37 is connected to AND gate 32 which is now enabled by the high output on line 31 causing the output of AND gate 32 to present the output of oscillator 12 on oscillator output line 14.

A select signal may be generated by a computer or an input device which will present a select signal on lines 15 to 19. It is not necessary that the selection be made manually as may be suggested by the schematic block diagram. Once the selection is made at logic element 20, a sequence of events is generated which causes the selective oscillator signal to be presented at AND gate 25 and the output of AND gate 25 is then employed as its own sync signal to select itself at logic element 22. Thus, it will be understood that it is impossible for an oscillator which selects itself to interfere with itself.

When oscillator 11 is again selected by selection means 15, an output signal on line 30 to AND gate 38 will generate a new sync signal. After AND gate 32 is blocked, the sync signal on line 29 will raise a select signal on line 23 to AND gate 39 effecting the selection of oscillator 11.

Figure 2:
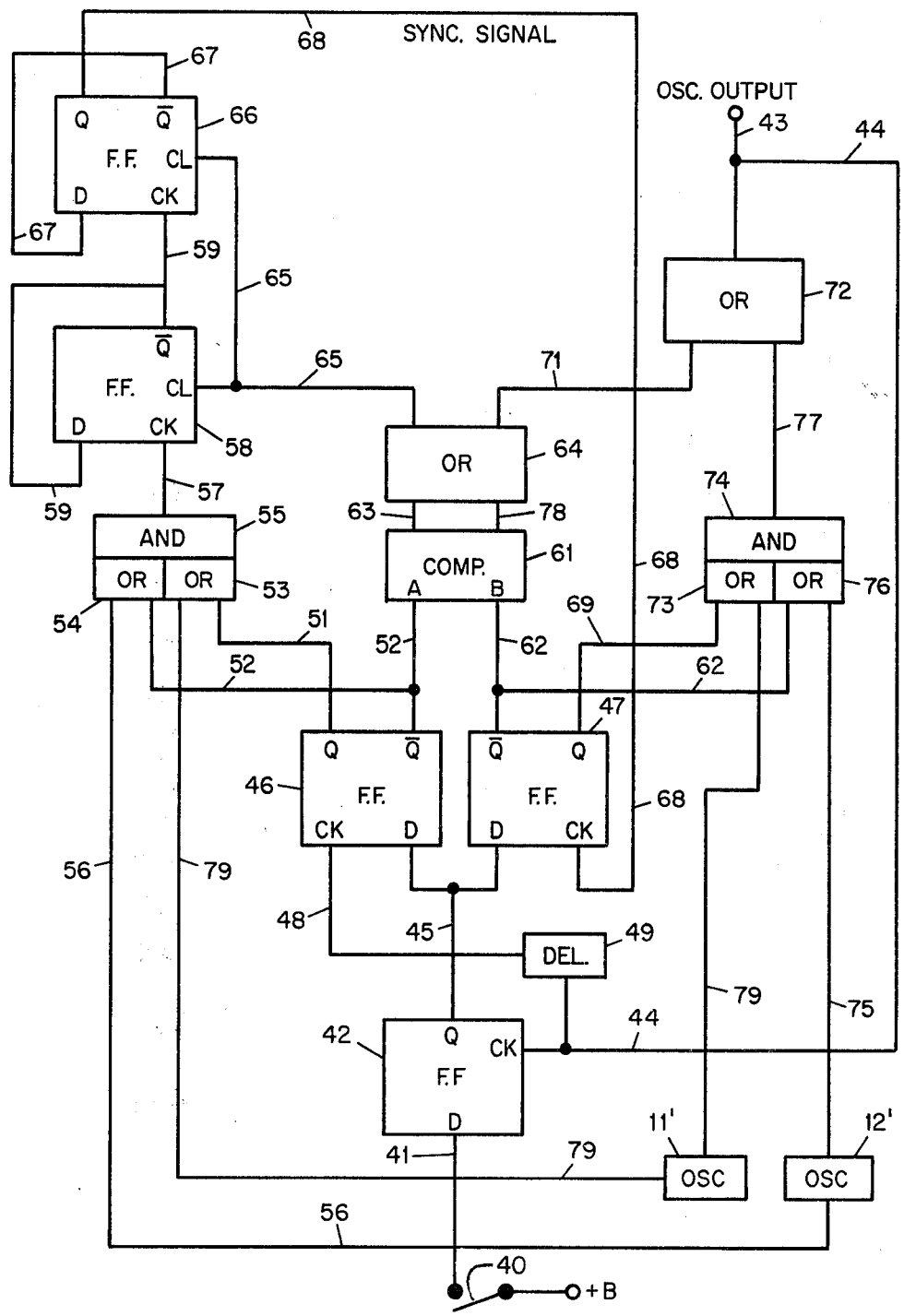
FIG. 2 is a detailed schematic block diagram of the preferred embodiment of FIG. 1 showing an implementation using simple gates and flip-flop elements.

Refer now to FIG. 2 showing more specifically a schematic block diagram having only two oscillators designated 11' and 12'. Switch selection means 40 generates a select signal on line 41 and need not designate the particular oscillator. The frequency select signal may instead signal the switching circuit 10' to change from one oscillator to the other oscillator. It will be understood that one of the two oscillators is effective to present an output signal on output line 43. Accordingly, a select-a-new-oscillator signal on line 41 enables the data input D to the D-type flip-flop 42. The oscillator output signal on line 44 is fed back to flip-flop 42 and connected to the clock input. When the clock input goes high, and the D input is high, the Q output of flip-flop 42 goes high at line 45. The high signal on line 45 is applied to the D-type flip-flops 46 and 47 as an enabling signal. Flip-flop 46 is a logic element for retaining the new select signal. The new select signal indicated at data input D of flip-flop 46 is clocked by an oscillator pulse from line 44 which is applied via line 48 to the clock input of flip-flop 46. It will be understood that a predetermined delay 49 may be employed between lines 44 and 48 or the next sequential clock pulse occurring after the clock pulse which triggered flip-flop 42 will clock the enabled data pulse at the D input of flip-flop 46. Since the D input was high when the clock arrived on line 48, it causes the Q output of flip-flop 46 to go high at line 51 and the $\overline{Q}$ output at line 52 to go low. There is a high input signal on line 51 to OR gate 53 and a low input signal on line 52 to OR gate 54. OR gate 53 enables its side of AND gate 55 and the oscillator signal from oscillator 12' on line 56 passes through OR gate 54 and subsequently through the other side of AND gate 55. The output of oscillator 12' appears at the output of AND gate 55 and appears at the clock input of D-type flip-flop 58. The $\overline{Q}$ output of flip-flop 58 on line 59 is recirculated back to the data input of the flip-flop 58 producing a divide by two output signal on line 59. To prevent the D-type flip-flop 58 from operating in random fashion, it is always cleared when the clock arrives on line 57 as follows. When D-type flip-flop 46 produced a high output on line 51, it also produced a low input on line 52 which is connected to the A input of comparator 61. The high output signal on line 41, which was applied to the data input of D-type flip-flop 47, has not yet been clocked through flip-flop 47 and the $\overline{Q}$ output is still low on line 62, presenting a low input to the B input of comparator 61. When the A input is high and the B input is low in comparator 61, the comparator senses that A is greater than B thus generating a high output signal on line 63, which is applied to OR gate 64 and appears at output line 65 as a low unblocking signal applied to the clear side of D-type flip-flop 58. This low signal permits the clock and data signals to produce an output on line 59 of flip-flop 58. The output appearing on line 59 of flip-flop 58 is applied at the clock input of D-type flip-flop 66. The $\overline{Q}$ output of flip-flop 66 is connected back to the data input of the flip-flop, thus producing a second divide by two element. When the enable signal on line 65 is also applied to flip-flop 66, the inputs on line 67 and 59 are clocked through to the output line 68 thus producing a sync signal. The signal on line 68 is in synchronism with oscillator 12' because it is produced by oscillator 12' but is delayed by the two flip-flops 58 and 66 for a short period of time. The sync signal on line 68 is recirculated back to D-type flip-flop 47 and is presented at the clock input causing the high data signal on line 45 to be produced at the Q output of flip-flop 47 on line 69.

When OR gate 64 produced the enable signal on line 65, it also produced on line 71 a disable signal which was applied to OR gate 72, thus disabling oscillator 11' output on line 43. The high signal on line 69 is applied to OR gate 73 and enables one side of AND gate 74. At this point in time, there is a low signal on line 62 from the Q output of flip-flop 47. Oscillator 12' is presenting high and low signals on line 75 at the input to OR gate 76 and passes through AND gate 74 which has been enabled by line 69 and OR gate 73. The output from AND gate 74 on line 77 was masked initially by the high output on line 71. However, when the data signal on line 45 drove the Q output of flip-flop 47 high, it also drove the Q output of flip-flop 47 low on line 62. When the outputs on line 52 and 62 are both low and A is equal to B, both the 63 and 78 outputs of comparator 61 go low. When the two inputs to OR gate 64 are low, the output on line 65 is high and disabling and the output on line 71 is low and enabling. OR gate 72 has a low input on line 71 when the signal from oscillator 12' on line 77 is applied, thus causing the output on line 43 to be the same as the output of oscillator 12'.

It will be understood that flip-flop 42 always presents one of two states. Thus, either a high or a low signal should be presented on line 41 to hold the flip-flop 42 in one of two states. After one of two signals is presented at flip-flop 42, the flip-flop 42 operates as a switch selection means for generating a select signal indicative of one of the oscillators and the flip-flops 46 and 47 operate as means responsive to this select signal for generating a new oscillator selection output signal in flip-flop 46 and an old oscillator selected output signal in flip-flop 47. The comparator means 61 and OR gate 64 determine whether the flip-flops 46 or 47 are the same, or different which indicates a change has occurred. When a change occurs, the output line 65 is enabled permitting the output from the newly selected oscillator to pass through AND gate 55 to the divide by two flip-flops 58 and 66 to generate the sync signal on line 68 which permits the newly selected oscillator to select itself at flip-flop 47.

After oscillator 12' is selected and it is desired that oscillator 11' be selected, the high signal on line 41 is changed to a low signal. The low signal on line 41 produces a low output on line 45 when the clock signal on line 44 clocks the data input through. A low signal on the data input of flip-flop 46 will produce a high output on line 52 which will enable OR gate 54 and the left side of AND gate 55, thus the oscillator signal from oscillator 11' being presented at OR gate 53 is passed through AND gate 55 and appears on line 57 to subsequently produce a sync signal on line 68 as explained hereinbefore. The sync signal on line 68 causes flip-flop 47 to assume the same state as that of flip-flop 46. Before the sync pulse arrived on line 68 at flip-flop 47, the flip-flops 46 and 47 were in a different state, thus causing comparator 61 and OR gate 64 to enable line 65 and disable line 71. After the sync pulse arrives at flip-flop 47, the flip-flops 46 and 47 are again made to appear the same and line 65 is disabled and line 71 is enabled, thus, permitting the newly selected oscillator 11' to pass its signal through OR gate 72. Line 62 is high enabling one side of AND gate 74. The output of oscillator 11' is applied to the other side of AND gate 74 and line 77 as well as the oscillator output 43.

Figure 3:
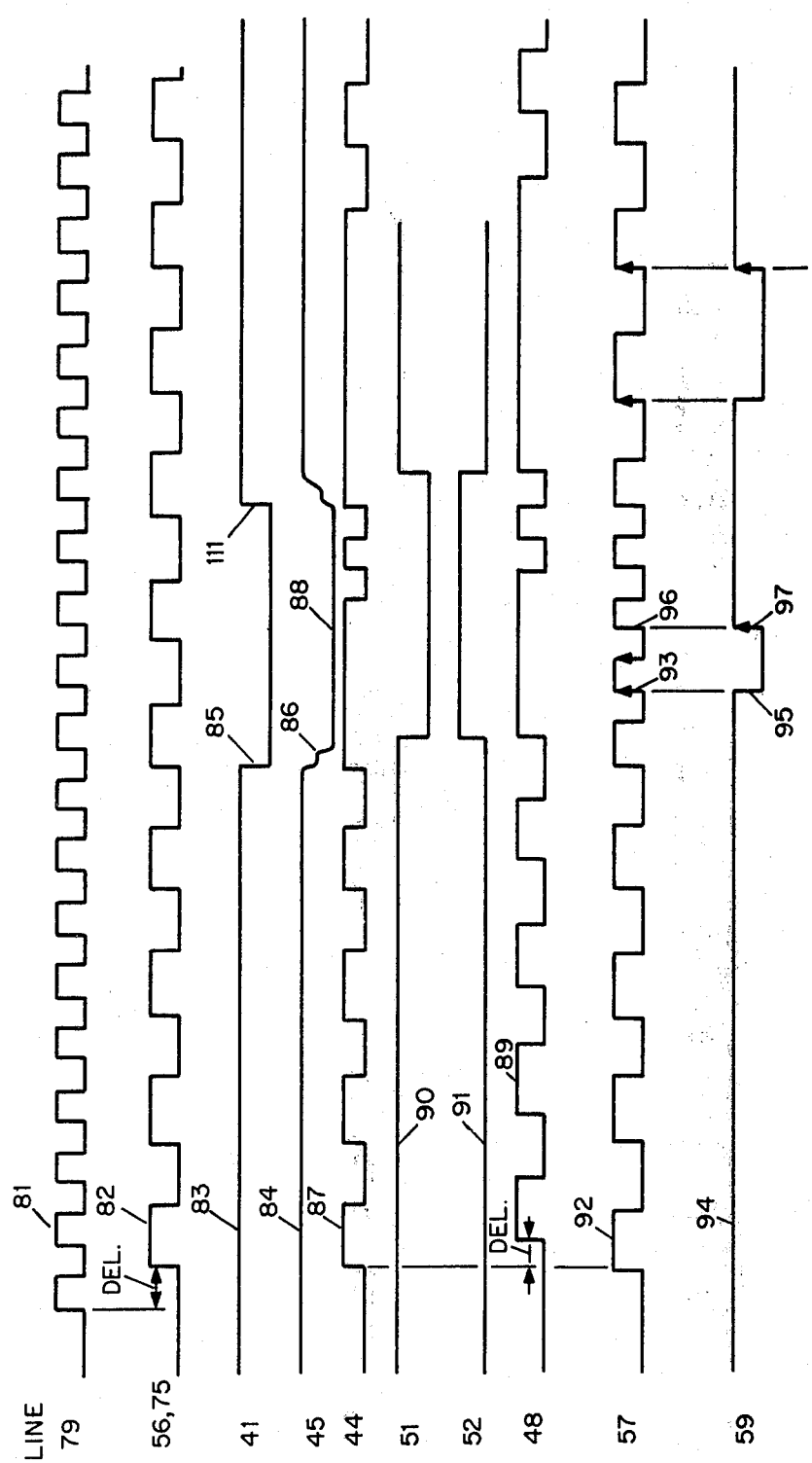

Refer now to FIGS. 3 and 4 showing the timing waveforms for the elements of FIG. 2. Waveform 81 is the same as the output of oscillator 11' which is appearing on line 79. Waveform 82 is the same as the output of oscillator 12' which is appearing on line 75 and 56. The frequency select signal 83 is shown as a high or low signal which is appearing at line 41 as the input to flip-flop 42. As explained hereinbefore, when the frequency select signal on line 41 was high the oscillator 12' was selected. When the frequency select signal on line 41 was changed from a high to a low signal, as occurs at point 85 of waveform 83, oscillator 11' was selected. There is no overlap of the selection signals. Exaggerated waveform 84 is representative of the output of flip-flop 42 on line 45. Point 86 represents a worse case occurrence of the switching on line 45 and may even represent a metastable condition. Waveform 87, which is the waveform on line 44, is the clock input to flip-flop 42 and edge triggers the data input at a transition point represented by point 85 on waveform 83. Thus, it will be understood that flip-flop 42 is switched into a high or a low state after the frequency select signal waveform 83 changes from high to low or low to high. The low region 88 of waveform 84 is representative of a stable state condition when the clock input of waveform 89 on line 48 appears to switch flip-flop 46. The outputs of flip-flop 46 on lines 51 and 52 are shown as waveforms 90 and 91 occurring after the metastable region 86 of waveform 84. Waveform 92 is representative of the output of one of the two oscillators occurring on line 57, in this case the newly selected oscillator is oscillator 11'. The first positive going pulse, which is permitted on line 57, is shown at point 93 at waveform 92. When waveform 92 goes high and flip-flop 58 is enabled, the output on line 59, which is shown as waveform 94, switches from high to low at point 95 as a result of the transition 93. The next following low to high pulse on waveform 92 is shown at point 96 which causes waveform 94 to go from low to high as shown at point 97. Transition 97 of waveform 94 causes waveform 98 on line 68 to go from low to high as shown as transition 99. Flip-flop 66 is enabled when transition 99 occurs. The leading edge of the sync pulse on line 68 recirculates back to flip-flop 47 which changes the state of the outputs of comparator 61 and OR gate 64, thus, creating the disabled pulse on line 65 which shuts off or changes the output of flip-flop 66 on line 68 (see waveform 98 at point 101). It will be understood that the time delay between transition 99 and transition 101 is approximately the time required for switching four logic elements. In this case the four logic elements which switched are flip-flop 47, comparator 61, OR gate 64 and flip-flop 66. The output of comparator 61 on line 63 and 78 are shown as waveforms 102 and 103. When the input signal on line 52 is greater than the signal on line 62, A is greater than B and a change is in progress as is shown at point 104. As explained hereinbefore, the sync pulse on line 68, shown on waveform 98, terminates the change in progress at comparator 61. The output of OR gate 64 on line 65 is shown as waveform 105 and is an inversion of waveform 102 at point 106. Similarly, waveform 107 which is the output of OR gate 64 on line 71 is the inversion of waveform 105.

Referring now to OR gate 105 of FIG. 2 and waveform 107 of FIGS. 3 and 4, it will be understood that OR gate 72 is enabled and low by waveform 107 until a change in progress takes place at point 108 causing OR gate 72 to be disabled. After the sync pulse 99, 101 occurs on line 68, waveform 107 on line 71 goes from high to low again enabling OR gate 72. During this change in progress that occurs at point 108, oscillator 11' has been substituted for oscillator 12' causing the output on line 43 to appear as shown on waveform 109.

Having explained how oscillator 11' is substituted for oscillator 12', it will be understood that the substitution of oscillator 12' for 11' is initiated by changing the frequency select signal on line 41, shown as waveform 83, from a low to a high condition. This change, shown at point 111 of waveform 83, initiates the change in progress output of comparator 61 shown as point 112 of waveform 103. This change in progress, point 112, also occurs on waveform 105 at point 113. It will be understood that point 113 is an enabling pulse on line 65 and occurs as an inverted pulse on waveform 107 at point 114 and is a disabling pulse at OR gate 72. The enabling pulse 113 results as the generation of a new sync pulse 115 on line 68 of waveform 98. The recirculation of the sync pulse 115 on line 68 back to flip-flop 47 changes the disable pulse 114 from a high level to a low level which again enables OR gate 72. The sync pulse on line 68, which generates the enable condition at OR gate 72, also switches oscillator 11' off and oscillator 12' on at AND gate 74 permitting the signal from oscillator 12' to appear at the output line 43 as shown on waveform 109.

FIG. 5 is a truth table for a preferred embodiment of a comparator such as that shown at block 61 of FIG. 2. In the stable condition the A and B inputs can either be high at both inputs and stable or low at both inputs and stable. During a change in progress, either the A input is high and the B input is low or the converse is true wherein the A input is low and the B input is high. As explained hereinbefore, the unstable condition where the inputs on lines 52 and 62 to comparator 61 are unequal is a condition which lasts for a short period of time until the sync pulse generated on line 68 is recirculated back to flip-flop 47 causing the newly selected oscillator to select itself at the output of AND gate 74 on line 77 which, in turn, generates the selected oscillator output on line 43.

Having explained a preferred embodiment and a detailed embodiment of the invention, it will be understood that various modifications and substitutions may be made in the logic circuitry without departing from the mode of operation and the scope of the invention as defined by the appended claims.

I claim:

1. A switching circuit for selecting one of a plurality of asynchronous oscillators comprising:
   a plurality of asynchronous oscillators adapted to be in an ON condition,
   switch selection means for generating a select signal indicative of one of said oscillators,
   means responsive to said select signal for generating a new oscillator selection output signal and an old oscillator selected output signal,
   comparator means coupled to means responsive to said select signal for determining if the new oscillator selection output signal is the same as the old oscillator selected output signal,
   said comparator means being provided with enabling and disabling output signals,
   first control selection means coupled to said asynchronous oscillators and said new oscillator selection output signal being enabled by said enabling output signals of said comparator means for generating a clock signal output in synchronism with said newly selected oscillator,
   second control selection means coupled to said asynchronous oscillators and said old oscillator selected output signal being disabled by said disabling output signal of said comparator means for discontinuing the output of said old oscillator,
   said clock signal output from said first control selection means being coupled to the means responsive to said select signal to change said old oscillator selected output signal to a delayed new oscillator selection output signal, and
   said second control selection means being coupled to said delayed new oscillator selection output signal for providing a newly selected oscillator signal.

2. A switching circuit as set forth in claim 1 wherein said means responsive to said select signal for generating a new oscillator selection output and an old oscillator selected output signal comprises a pair of counters.

3. A switching circuit as set forth in claim 2 wherein said counters comprise a pair of bistable flip-flops.

4. A switching circuit as set forth in claim 2 wherein said first control selection means comprises a normally enabled AND gate coupled to a normally disabled AND gate, said normally disabled AND gate being enabled when a new oscillator selection output signal differs from the old oscillator selection output signal.

5. A switching circuit as set forth in claim 4 wherein said second control selection means comprises a normally enabled AND gate coupled to a normally enabled AND gate, said normally enabled AND gate being disabled when a new oscillator selection output signal differs from the old oscillator selection output signal.

6. A switching circuit as set forth in claim 2 wherein first control selection means comprises a normally enabled AND gate coupled to a normally disabled AND gate, said normally disabled AND gate comprising a bistable flip-flop.

7. A switching circuit as set forth in claim 6 wherein said bistable flip-flop is connected to provide a divide by two output.

8. A switching circuit as set forth in claim 2 wherein said first control selection means comprises a normally enabled AND gate coupled to a plurality of logic elements each forming a discrete delay.

9. A switching circuit as set forth in claim 1 wherein said switch selection means comprises a flip-flop having an output connected to said means responsive to said select signal.

10. A switching circuit as set forth in claim 9 wherein said flip-flop output is enabled by a switch selection signal and clocked by said old oscillator output signal.

* * * * *